(12) United States Patent
Gao et al.

(10) Patent No.: US 11,716,547 B2
(45) Date of Patent: Aug. 1, 2023

(54) SAMPLE AND HOLD SWITCH DRIVER CIRCUITRY WITH SLOPE CONTROL

(71) Applicant: OMNIVISION TECHNOLOGIES, INC., Santa Clara, CA (US)

(72) Inventors: Zhe Gao, San Jose, CA (US); Ling Fu, Santa Clara, CA (US); Yu-Shen Yang, San Jose, CA (US); Tiejun Dai, Santa Clara, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 76 days.

(21) Appl. No.: 17/530,316

(22) Filed: Nov. 18, 2021

(65) Prior Publication Data

US 2022/0078360 A1 Mar. 10, 2022

Related U.S. Application Data

(62) Division of application No. 16/516,067, filed on Jul. 18, 2019, now Pat. No. 11,212,467.

(51) Int. Cl.
| | | |
|---|---|---|
| *H04N 25/44* | (2023.01) | |
| *G11C 27/02* | (2006.01) | |
| *H04N 25/75* | (2023.01) | |
| *H04N 25/79* | (2023.01) | |

(52) U.S. Cl.
CPC ............ *H04N 25/44* (2023.01); *G11C 27/02* (2013.01); *H04N 25/75* (2023.01); *H04N 25/79* (2023.01)

(58) Field of Classification Search
CPC ........ H04N 25/44; H04N 25/75; H04N 25/79; H04N 25/616; H04N 25/745; H04N 25/76; G11C 27/02; G11C 27/024; H01L 27/14612
See application file for complete search history.

(56) References Cited

U.S. PATENT DOCUMENTS

| | | | |
|---|---|---|---|
| 8,149,310 | B2 | 4/2012 | Yin |
| 2002/0105339 | A1 | 8/2002 | Nagaraj |
| 2003/0201803 | A1* | 10/2003 | Kim ...................... G11C 11/419 327/108 |
| 2005/0237400 | A1 | 10/2005 | Blerkom et al. |
| 2006/0256220 | A1 | 11/2006 | Rysinki et al. |

(Continued)

FOREIGN PATENT DOCUMENTS

| | | |
|---|---|---|
| TW | 201039629 A | 11/2010 |
| TW | 201622359 A | 6/2016 |

OTHER PUBLICATIONS

Taiwanese Office Action, dated May 25, 2021, issued in counterpart Taiwanese Application No. 109123620, filed Jul. 13, 2020, 10 pages.

*Primary Examiner* — Lin Ye
*Assistant Examiner* — Tuan H Le
(74) *Attorney, Agent, or Firm* — Perkins Coie LLP (57) ABSTRACT

A switch driver circuit includes a plurality of pullup transistors. The plurality of pullup transistors includes a first pullup transistor coupled between a voltage supply and a first output node. A plurality of pulldown transistors includes a first pulldown transistor coupled between the first output node and a ground node. A slope control circuit is coupled to the ground node. A plurality of global connection switches includes a first global connection switch coupled between the first output node and the slope control circuit.

20 Claims, 8 Drawing Sheets

(56) References Cited

U.S. PATENT DOCUMENTS

| | | | |
|---|---|---|---|
| 2010/0060320 A1* | 3/2010 | Lee | G11C 7/1057 |
| | | | 365/189.14 |
| 2010/0194945 A1 | 8/2010 | Chiu et al. | |
| 2012/0241594 A1 | 9/2012 | Noiret et al. | |
| 2016/0072446 A1* | 3/2016 | Jeong | H03F 3/45219 |
| | | | 330/260 |
| 2016/0094236 A1 | 3/2016 | Shionoiri et al. | |
| 2017/0023966 A1 | 1/2017 | Kim et al. | |
| 2017/0063354 A1* | 3/2017 | Chang | G06F 13/4072 |
| 2018/0109251 A1* | 4/2018 | Djelassi | H03K 3/3565 |
| 2018/0351546 A1* | 12/2018 | Horváth | H03K 17/284 |
| 2020/0145597 A1* | 5/2020 | Prathipati | H04N 25/63 |
| 2020/0162072 A1* | 5/2020 | Hen | H03K 19/0005 |

* cited by examiner

SAMPLE AND HOLD SWITCH DRIVER CIRCUITRY WITH SLOPE CONTROL

CROSS-REFERENCE TO RELATED APPLICATION

This application is a divisional application of U.S. patent application Ser. No. 16/516,067 filed on Jul. 18, 2019, now pending. U.S. patent application Ser. No. 16/516,067 is hereby incorporated by reference.

BACKGROUND INFORMATION

Field of the Disclosure

This disclosure relates generally to image sensors, and in particular but not exclusively, relates to sample and hold switch driver circuitry for use in reading out image data from an image sensor.

Background

Image sensors have become ubiquitous. They are widely used in digital still cameras, cellular phones, security cameras, as well as, medical, automobile, and other applications. The technology used to manufacture image sensors has continued to advance at a great pace. For example, the demands of higher resolution and lower power consumption have encouraged the further miniaturization and integration of these devices.

Image sensors conventionally receive light on an array of pixels, which generates charge in the pixels. The intensity of the light may influence the amount of charge generated in each pixel, with higher intensity generating higher amounts of charge. Correlated double sampling (CDS) is a technique that is used with CMOS image sensors (CIS) to reduce noise from images read out from image sensors by sampling image data from the image sensors and removing undesired offsets sampled from reset value readings from the image sensors. In global shutter CIS design, sample and hold switches are used to sample and hold signal (SHS) readings, as well as sample and hold reset (SHR) readings from the image sensors. The SHR and SHS switches in the sample and hold circuitry are controlled to sample the reset levels and the signal levels from the image sensor respectively. Ideally, during a global sampling phase, all sample and hold switches toggle at the same time to sample the whole frame from the image sensor into storage capacitors. After the global sampling is completed, a row-by-row read out from the image sensor is performed to digitize the sampled reset and signal levels. The digitized difference between the reset and signal levels are used in the CDS calculation to recover the true image signals.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples directed to a sample and hold switch driver circuit with slope control are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

Figure 1:
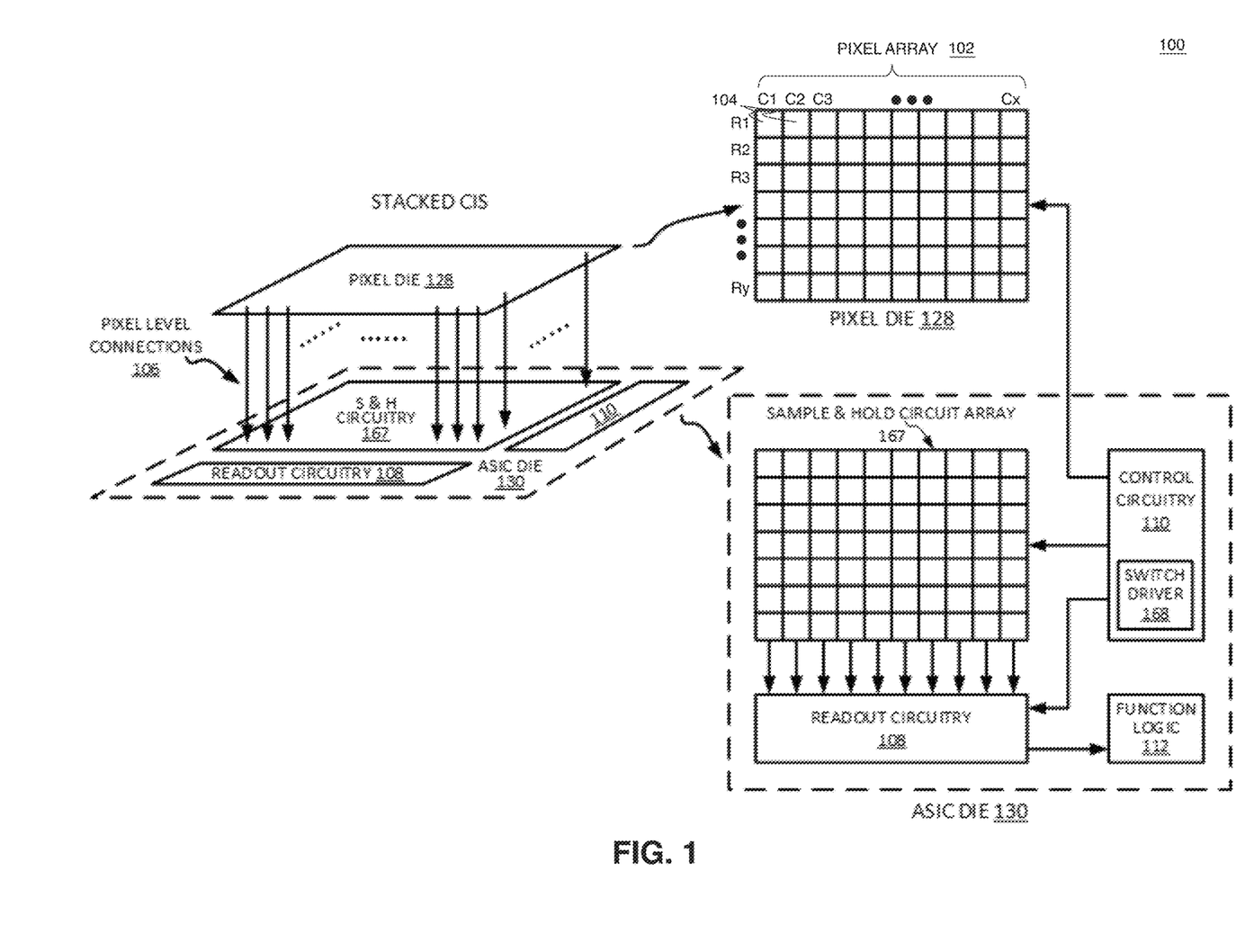
FIG. 1 illustrates one example of an imaging system in accordance with the teachings of the present invention.

FIG. 1 illustrates one example of an imaging system 100 in accordance with an embodiment of the present disclosure. As shown in the example depicted in FIG. 1, imaging system 100 is implemented as a CMOS image sensor (CIS) in a stacked chipped scheme that includes a pixel die 128 stacked with a logic die or application specific integrated circuit (ASIC) die 130. In the example, the pixel die 128 includes a pixel array 102, and the ASIC die 130 includes an array of sample and hold circuits 167 that are coupled to the pixel array 102 through pixel level connections 106. ASIC die 130 also includes control circuitry 110, readout circuitry 108, and function logic 112. In one example, pixel array 102 is a two-dimensional (2D) array of photodiodes, or image sensor pixel cells 104 (e.g., pixels P1, P2 . . . , Pn). As illustrated, photodiodes are arranged into rows (e.g., rows R1 to Ry) and columns (e.g., column C1 to Cx) to acquire image data of a person, place, object, etc., which can then be used to render a 2D image of the person, place, object, etc. However, photodiodes do not have to be arranged into rows and columns and may take other configurations.

In one example, readout circuitry 108 may be coupled to read out image data from the plurality of photodiodes 104 in pixel array 102 through the sample and hold circuitry 167. As will be described in greater detail below, in one example, the sample and hold circuitry 167 includes a plurality of sample and hold circuits that are coupled to the pixel cells 104 at the pixel level to sample and hold reset values as well as signal values from pixel array 102 through pixel level connections 106. The image data that is readout by readout circuitry 108 may then be transferred to function logic 112. In various examples, readout circuitry 108 may also include amplification circuitry, analog to digital (ADC) conversion circuitry, or otherwise.

In one example, function logic 112 may simply store the image data or even manipulate the image data by applying post image effects (e.g., crop, rotate, remove red eye, adjust brightness, adjust contrast, or otherwise). In one example, readout circuitry 108 may readout a row of image data at a time along readout column lines (illustrated) or may readout the image data using a variety of other techniques (not illustrated), such as a serial readout or a full parallel readout of all pixels 104 simultaneously.

In one example, control circuitry 110 is coupled to pixel array 102 to control operation of the plurality of photodiodes in pixel array 102. As will also be described in greater detail below, control circuitry 110 also includes a switch driver 168 that is coupled to generate the control signals to control the sample and hold circuitry 167 to sample and hold the reset values and signal values from pixel array 102. In the depicted example, the control circuitry 110 is also coupled to generate a shutter signal for controlling image acquisition. In one example, the shutter signal is a global shutter signal for simultaneously enabling all pixel cells 104 within pixel array 102 to simultaneously capture their respective image data during a single acquisition window. In one example, image acquisition is synchronized with lighting effects such as a flash.

In one example, imaging system 100 may be included in a digital camera, cell phone, laptop computer, or the like. Additionally, imaging system 100 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 100, extract image data from imaging system 100, or manipulate image data supplied by imaging system 100.

Figure 2:
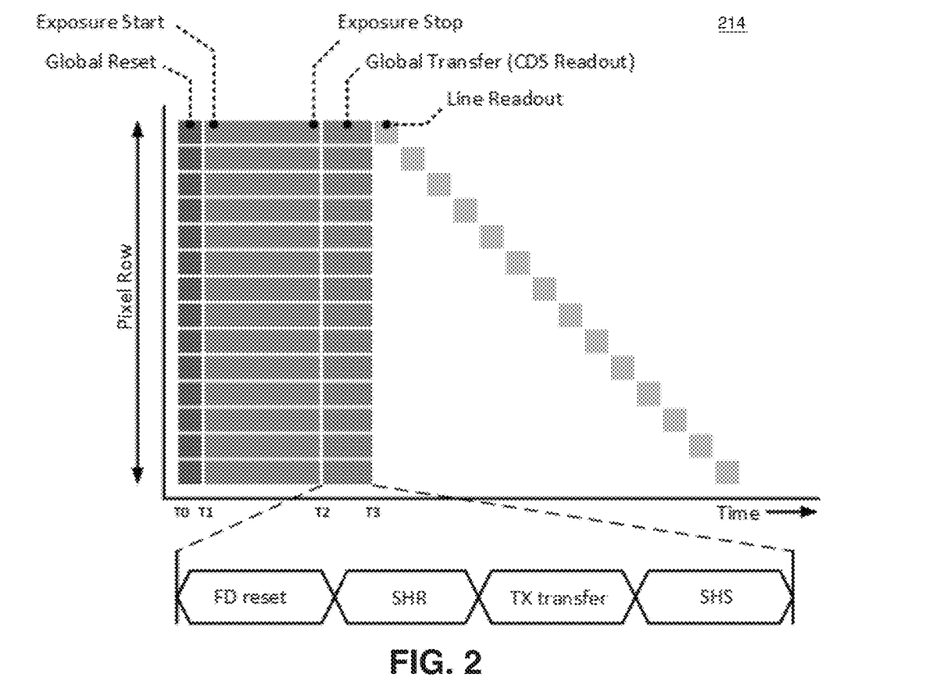
FIG. 2 an example timing diagram that illustrates the timing of line readouts of pixel rows in an image sensor in accordance with the teachings of the present invention.

FIG. 2 an example timing diagram 214 that illustrates the timing of line readouts of pixel rows in an image sensor in accordance with the teachings of the present invention, as included for instance in imaging system 100 of FIG. 1. As mentioned, in the depicted example, imaging system 100 is implemented with a global shutter design and correlated double sampling (CDS). As such, a global reset operation occurs at time T0. At time T1, an exposure or integration period begins. At time T2, the exposure or integration period ends. As shown in the depicted example, a global transfer operation or CDS readout operation occurs between time T2 and time T3. In one example, the global transfer operation begins with a floating diffusion reset (FD reset), after which time reset levels from the pixel array 102 may be sampled and held (SHR). Then, a transfer operation of signal levels may occur (TX transfer), after which time the signal levels from the pixel array 102 may be sampled and held (SHS). With the reset levels and the signal levels from the pixel array 102, the CDS calculation may be obtained to provide the true image data signals from the pixel array 102. After time T3, the line readout operations from the pixel array 102 may be begin, row by row.

Figure 3:
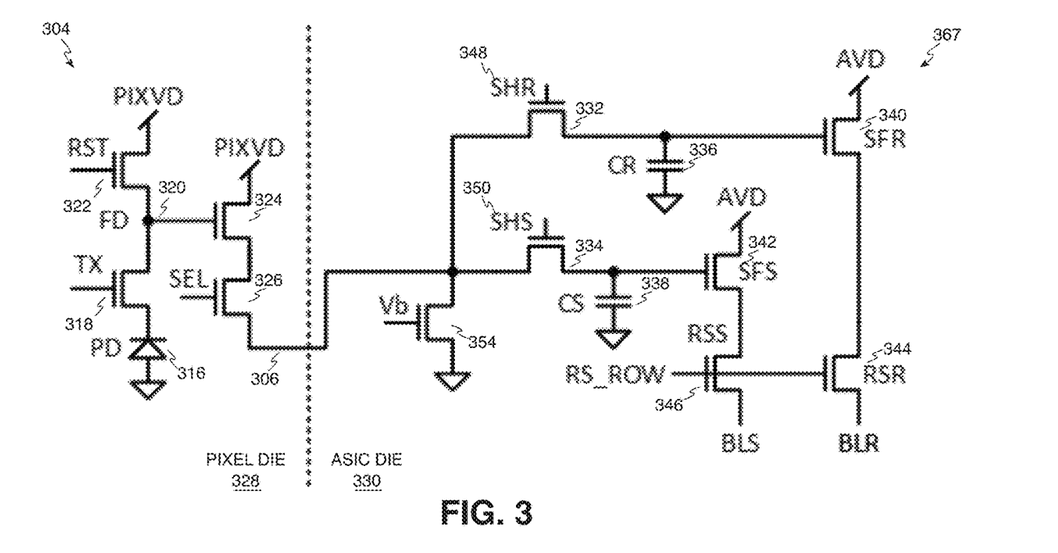
FIG. 3 shows a schematic of an example of pixel cell and an example sample and hold circuit in an image sensor in accordance with the teachings of the present invention.

FIG. 3 shows a schematic of an example of pixel cell 304 and an example of sample and hold circuit 367 in an image sensor in accordance with the teachings of the present invention. It is noted that pixel cell 304 and sample and hold circuit 367 of FIG. 3 may be examples of one of the pixel cells 104 and one of the circuits of sample and hold circuitry 167 described in FIG. 1, and that similarly named and numbered elements referenced below are coupled and function similar to as described above. As shown in the depicted example, pixel cell 304 includes a photodiode 316, which is coupled to photogenerate image charge in response to incident light. A transfer transistor 318 is coupled to transfer the photogenerated image charge from the photodiode 316 to a floating diffusion 320 in response to a transfer signal TX. A reset transistor 322 is coupled to a pixel voltage supply to reset the floating diffusion 320 in response to a reset signal RST. The gate of a source follower transistor 324 is coupled to convert the charge in the floating diffusion 320 to an image data signal, which is coupled to be output through a row select transistor 326 through pixel level connection 306 in response to a row select signal SEL. In an imaging system that utilizes CDS, the charge on the floating diffusion 320 is also read out through the pixel level connection 306 after a floating diffusion reset operation to obtain a reset level, and the charge on the floating diffusion 320 is also read out through the pixel level connection 306 after the image charge is transferred to the floating diffusion 320 to obtain a signal level.

Continuing with the depicted example, the sample and hold circuit 367 includes a first sample and hold switch 332 that is coupled to the pixel level connection 306 to sample and hold the reset level from pixel cell 304 into capacitor CR 336 in response to a sample and hold reset control signal SHR 348. In addition, the sample and hold circuit 367 also includes a second sample and hold switch 334 that is coupled to the pixel level connection 306 to sample and hold the signal level from pixel cell 304 into capacitor CS 338 in response to a sample and hold signal control signal SHS 350. As will be discussed in greater detail below, the sample and hold reset control signal SHR 348 and the sample and hold signal control signal SHS 350 are generated by a sample and hold switch driver circuitry with slope control in accordance with the teachings of the present invention. In the depicted example, a transistor 354 that is biased with a bias voltage Vb is coupled between the pixel level connection 306 and ground.

The example depicted in FIG. 3 also shows that a source follower transistor 340 has a gate coupled to capacitor CR 336 to convert the sampled reset voltage level held in capacitor CR 336 to a reset level output signal, which is output through a reset level row select transistor 344 in response to a row select RS_ROW signal to a bitline reset BLR output. In addition, the example shown in FIG. 3 also shows that a source follower transistor 342 has a gate coupled to capacitor CS 338 to convert the sampled signal voltage level held in capacitor CS 338 to a signal level output signal, which is output through a signal level row select transistor 346 in response to the row select RS_ROW signal to a bitline signal BLS output.

It is noted that ideally, during a global transfer phase in an image sensor with a global shutter that all the sample and hold switches behave identically to realize perfect signal sampling to generate a high quality image. However, in practice, due to the imperfections in the sampling operations, including for instance (1) propagation delays of global enable signals, (2) power supply parasitic resistances/capacitances (RCs), and/or (3) mismatches among each of the SHR and SHS control signal drivers in different rows, the performance of the sample an hold operations is not ideal. For instance, horizontal fixed pattern noise (HFPN) and optical black (OB) shifts may occur due to non-idealities in sample and hold operations.

As will be discussed in greater detail below, these non-idealities in global sample and hold operations are mitigated with global switch-off slope control in accordance with the teachings of the present invention. In the various examples, the sample and hold switch-off operation is the most important, and the sample and hold switch-on operation is not as crucial. By controlling the slope of the switch-off operation of the sample and hold switches, the overall performance of all of the sample and hold switches behaving as identically as reasonably possible across all of the rows of the pixel array in the imaging system is improved in accordance with the teachings of the present invention.

Figure 4:
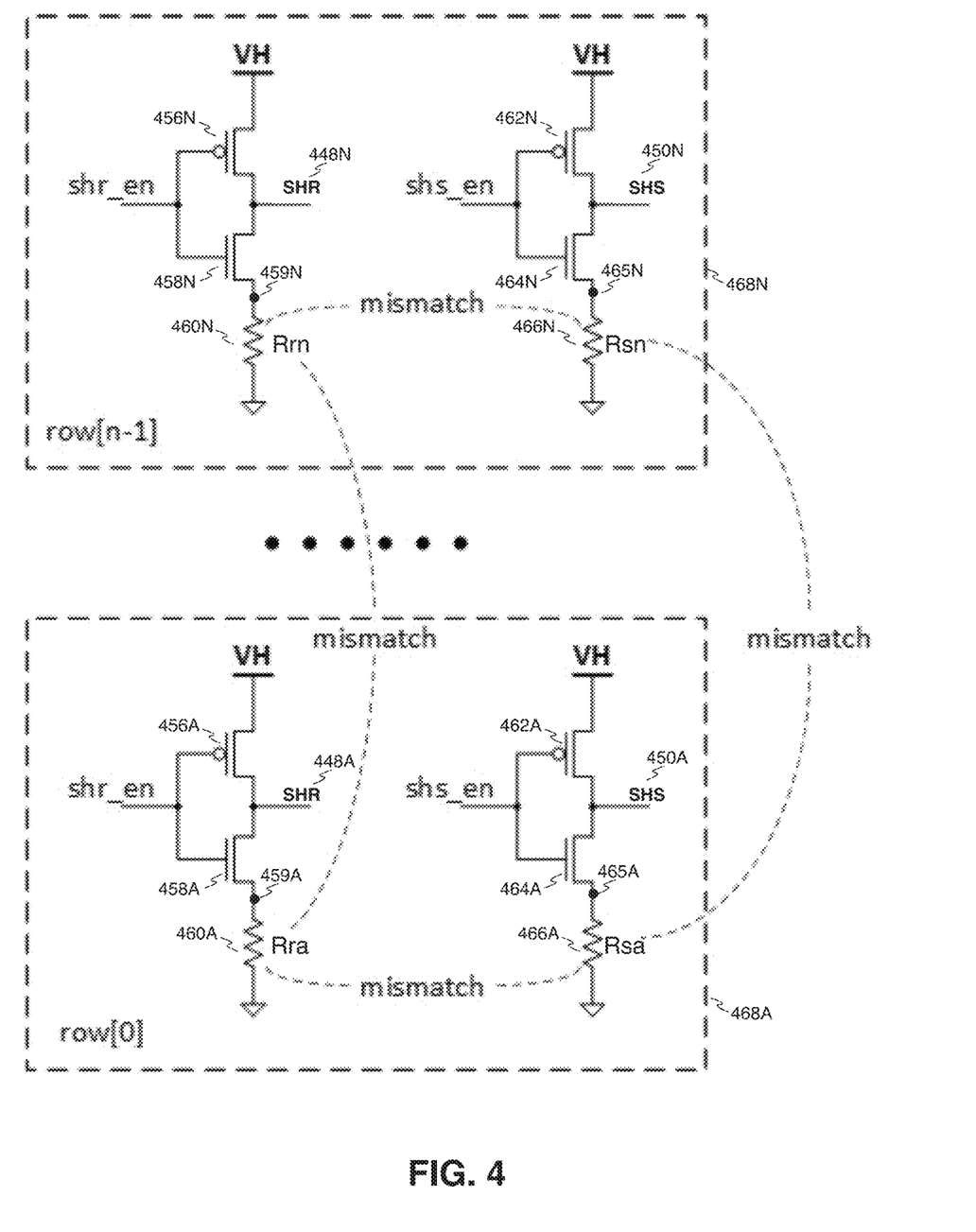
FIG. 4 shows a schematic of an example sample and hold switch driver with slope control in an image sensor in accordance with the teachings of the present invention.

For instance, FIG. 4 shows a schematic of one example of a sample and hold switch driver with slope control in an image sensor in accordance with the teachings of the present invention. As shown in the depicted example, the sample and hold switch driver circuitry includes a switch driver 468A coupled to output a sample and hold reset control signal SHR 448A and a sample and hold signal control signal SHS 450A for a first row (e.g., row[0]) of a pixel array, and a switch driver 468N coupled to output a sample and hold reset control signal SHR 448N and a sample and hold signal control signal SHS 450N for a second row (e.g., row[n−1]) of the pixel array. It is noted that sample and hold reset control signals 448 (SHR) and sample and hold signal control signals 450 (SHS) described in FIG. 4 may be examples of the sample and hold reset control signal SHR 348 and sample and hold signal control signal SHS 350 described in FIG. 3, and that similarly named and numbered elements referenced below are coupled and function similar to as described above.

As shown in the example depicted in FIG. 4, the sample and hold switch driver with slope control includes a switch driver 468A that includes a first transistor 456A coupled between a voltage supply VH and a first output node, which is coupled to output the sample and hold reset control signal SHR 448A. A second transistor 458A is coupled between the first output node and a first discharge node 459A. A first slope control circuit 460A is coupled to the first discharge node 459A to discharge the first discharge node 459A at a first slope. A third transistor 462A is coupled between the voltage supply VH and a second output node, which is coupled to output the sample and hold signal control signal 450A. A fourth transistor 464A is coupled between the second output node and a second discharge node 465A. A second slope control circuit 466A is coupled to the second discharge node 465A to discharge the second discharge node 465A at a second slope.

In the depicted example, the first and second slopes are mismatched. For instance, in one example, the first slope control circuit 460A is a first resistor having a first resistance Rra, and the second slope control circuit 466A is a second resistor having a second resistance Rsa. In the example, the first resistor Rra and the second resistor Rsa are mismatched with one another.

In one example, the sample and hold reset control signal SHR 448A output at the first output node is coupled to drive a first sample and hold switch coupled to a first row (e.g., row[0]) of a pixel array. The first sample and hold switch of the first row of the pixel array may correspond to for instance the sample and hold reset switch 332 shown in FIG. 3. In the example, the sample and hold signal control signal SHS 450A output at the second output node is coupled to drive a second sample and hold switch coupled to a first row (e.g., row[0]) of the pixel array. The second sample and hold switch of the first row of the pixel array may correspond to for instance the sample and hold signal switch 334 shown in FIG. 3.

Continuing with the depicted example, the sample and hold switch driver with slope control further includes a switch driver 468N that includes a fifth transistor 456N coupled between the voltage supply VH and a third output node, which is coupled to output the sample and hold reset control signal SHR 448N. A sixth transistor 458N is coupled between the third output node and a third discharge node 459N. A third slope control circuit 460N is coupled to the third discharge node 459N to discharge the third discharge node 459A at a third slope. A seventh transistor 462N is coupled between the voltage supply VH and a fourth output node, which is coupled to output the sample and hold signal control signal SHS 450N. An eighth transistor 464N is coupled between the fourth output node and a fourth discharge node 465N. A fourth slope control circuit 466N is coupled to the fourth discharge node 465N to discharge the fourth discharge node 465N at a fourth slope.

In the depicted example, the third and fourth slopes are mismatched, the first and third slopes are mismatched, and the second and fourth slopes are mismatched. For instance, in one example, the third slope control circuit 460N is a third resistor having a third resistance Rrn, and the fourth slope control circuit comprises a fourth resistor having a fourth resistance Rsn. In the example, the third resistor Rrn and the fourth resistor Rsn, the first resistor Rra and the third resistor Rrn are mismatched, and the second resistor Rsa and fourth resistor Rsn are mismatched with one another.

In one example, the sample and hold reset control signal SHR 448N output at the third output node is coupled to drive a first sample and hold switch coupled to a second row (e.g., row[n−1]) of a pixel array. The first sample and hold switch of the second row of the pixel array may correspond to for instance the sample and hold reset switch 332 shown in FIG. 3. In the example, the sample and hold signal control signal SHS 450N output at the fourth output node is coupled to drive a second sample and hold switch coupled to a second row (e.g., row[n−1]) of the pixel array. The second sample and hold switch of the second row of the pixel array may correspond to for instance the sample and hold signal switch 334 shown in FIG. 3.

Figure 5:
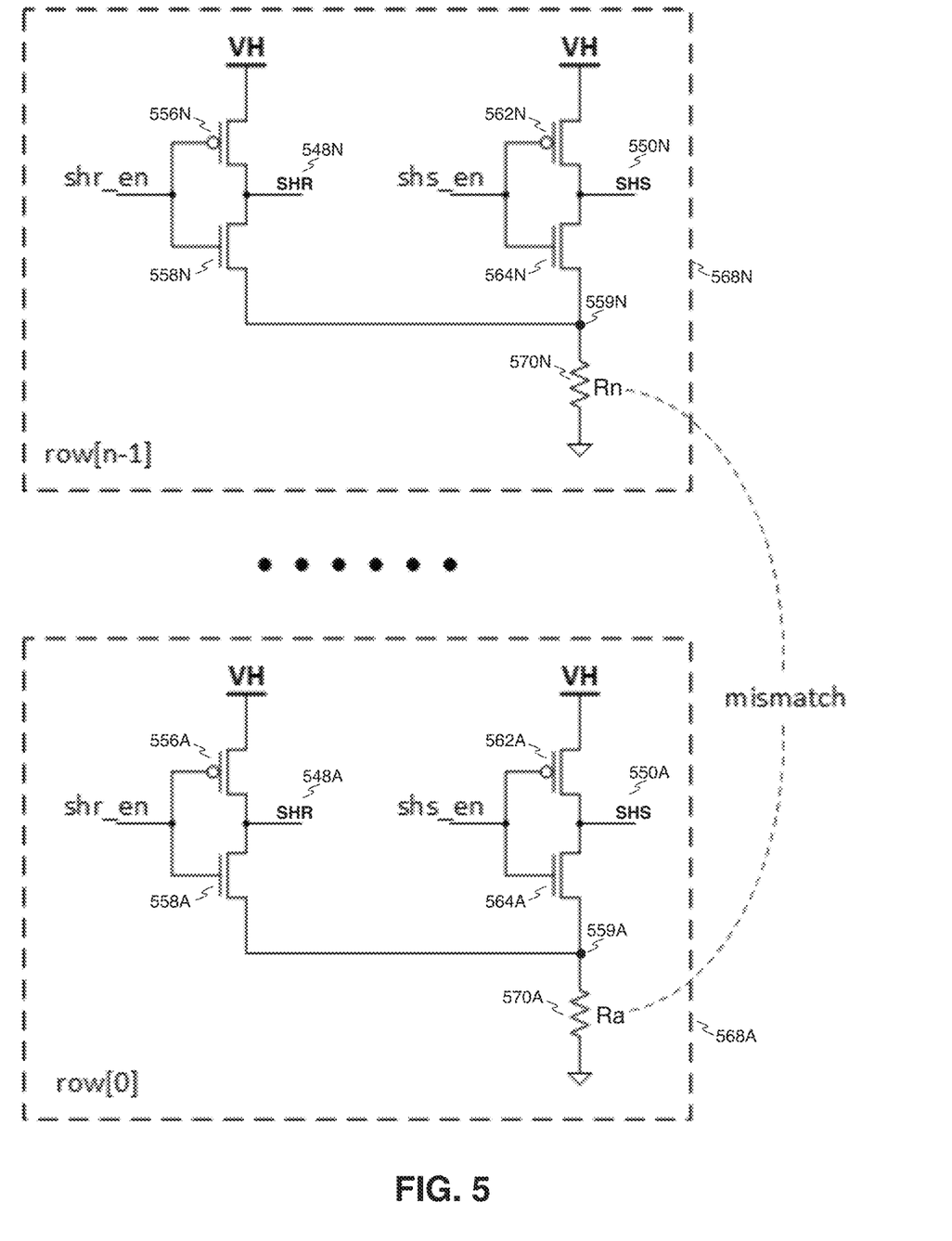
FIG. 5 shows a schematic of another example sample and hold switch driver with slope control in an image sensor in accordance with the teachings of the present invention.

FIG. 5 shows a schematic of another example of a sample and hold switch driver with slope control in an image sensor in accordance with the teachings of the present invention. As shown in the depicted example, the sample and hold switch driver circuitry includes a switch driver 568A coupled to output a sample and hold reset control signal SHR 548A and a sample and hold signal control signal SHS 550A for a first row (e.g., row[0]) of a pixel array, and a switch driver 568N coupled to output a sample and hold reset control signal SHR 548N and a sample and hold signal control signal SHS 550N for a second row (e.g., row[n−1]) of the pixel array. It is noted that sample and hold reset control signals 548 (SHR) and sample and hold signal control signals 550 (SHS) described in FIG. 5 may be examples of the sample and hold reset control signal SHR 348 and sample and hold signal control signal SHS 350 described in FIG. 3, and that similarly named and numbered elements referenced below are coupled and function similar to as described above.

As shown in the example depicted in FIG. 5, the sample and hold switch driver with slope control includes a switch driver 568A that includes a first transistor 556A coupled between a voltage supply VH and a first output node, which is coupled to output the sample and hold reset control signal SHR 548A. A second transistor 558A is coupled between the first output node and a first discharge node 559A. A first slope control circuit 570A is coupled to the first discharge node 559A to discharge the first discharge node 559A at a first slope.

A switch driver 568N includes third transistor 556N that is coupled between the voltage supply VH and a second output node, which is coupled to output the sample and hold reset control signal SHR 548N. A fourth transistor 558N is coupled between the second output node and a second discharge node 559N. A second slope control circuit 570N is coupled to the second discharge node 559N to discharge the second discharge node 559N at a second slope.

In the depicted example, the first and second slopes are mismatched. For instance, in one example, the first slope control circuit 570A is a first resistor having a first resistance Ra, and the second slope control circuit 570N is a second resistor having a second resistance Rn. In the example, the first resistor Ra and the second resistor Rn are mismatched with one another.

In one example, the sample and hold reset control signal SHR 548A output at the first output node is coupled to drive a first sample and hold switch coupled to a first row (e.g., row[0]) of a pixel array. The first sample and hold switch of the first row of the pixel array may correspond to for instance the sample and hold reset switch 332 shown in FIG. 3. In the example, the sample and hold signal control signal SHR 548N output at the second output node is coupled to drive a first sample and hold switch coupled to a second row (e.g., row[n−1]) of the pixel array. The first sample and hold switch of the second row of the pixel array may also correspond to for instance the sample and hold reset switch 332 shown in FIG. 3.

Continuing with the depicted example, switch driver 568A includes a fifth transistor 562A coupled between the voltage supply VH and a third output node, which is coupled to output the sample and hold signal control signal SHS 550A. A sixth transistor 564A is coupled between the third output node and the first discharge node 559A. Switch driver 568N includes a seventh transistor 562N coupled between the voltage supply VH and a fourth output node, which is coupled to output the sample and hold signal control signal SHS 550N. An eighth transistor 564N is coupled between the fourth output node and the second discharge node 559N.

In one example, the sample and hold signal control signal SHS 550A output at the third output node is coupled to drive a second sample and hold switch coupled to a first row (e.g., row[0]) of the pixel array. The second sample and hold switch of the first row of the pixel array may correspond to for instance the sample and hold signal switch 334 shown in FIG. 3. In the example, the sample and hold signal control signal SHS 550N output at the fourth output node is coupled to drive a second sample and hold switch coupled to a second row (e.g., row[n−1]) of the pixel array. The second sample and hold switch of the second row of the pixel array may also correspond to for instance the sample and hold signal switch 334 shown in FIG. 3.

Figure 6A:
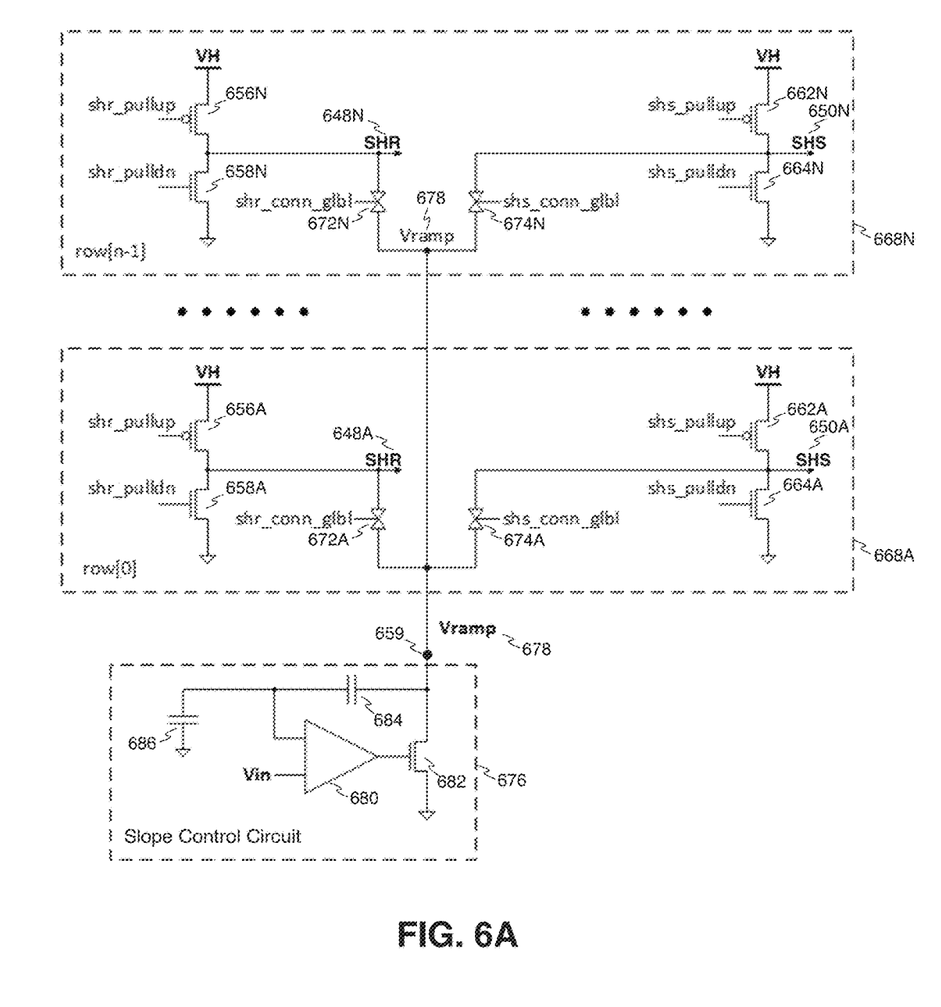
FIG. 6A shows a schematic of yet another example sample and hold switch driver with slope control in an image sensor in accordance with the teachings of the present invention.

FIG. 6A shows a schematic of yet another example of a sample and hold switch driver with slope control in an image sensor in accordance with the teachings of the present invention. As shown in the depicted example, the sample and hold switch driver circuitry includes a switch driver 668A that includes a plurality of pullup transistors, which includes a first pullup transistor 656A. As shown, first pullup transistor 656A is coupled between a voltage supply VH and a first output node, which is coupled to output a sample and hold reset control signal SHR 648A. In one example, the sample and hold reset control signal SHR 648A is coupled to drive a first sample and hold switch coupled to a first row (e.g., row[0]) of a pixel array. The first sample and hold switch of the first row of the pixel array may correspond to for instance the sample and hold reset switch 332 shown in FIG. 3. Switch driver 668A also includes a plurality of pulldown transistors, which includes a first pulldown transistor 658A that is coupled between the first output node and a ground node. A slope control circuit 676 is also coupled to the ground node, and a plurality of global connection switches, which includes a first global connection switch 672A that is coupled between the first output node and the slope control circuit 676.

In the example depicted in FIG. 6A, slope control circuit 676 is coupled to a discharge node 659 that is coupled to the first global connection switch 672A. In the example, slope control circuit 676 is an active discharge circuit that includes active devices that are coupled to discharge the discharge node 659. In particular, in the example illustrated in FIG. 6A, the active discharge circuit of slope control circuit 676 includes a ramp generator that is coupled to generate a ramp signal Vramp 678 at discharge node 659. As such, the ramp generator of slope control circuit 676 is coupled to control the discharge of the discharge node 659 at a slope determined by the ramp signal Vramp 678. In one example, slope control circuit 676 includes a transistor 682 that is coupled between the discharge node 659 and ground. The control terminal, or gate, of transistor 682 is coupled to an output of an operational amplifier 680. A capacitor 684 is coupled between the discharge node 659 and a first input of the operational amplifier 680. Another capacitor 686 is coupled between the first input of the operational amplifier 680. A second input of the operational amplifier 680 is coupled to receive an input voltage Vin. In one example, the input voltage Vin may be a ramp signal with a smaller voltage range. As will discussed in further detail below, in one example, a ramp event is configured to occur in the ramp signal Vramp 678 while the first global connection switch 672A is in an activated state, and while the first pullup transistor 656A and the first pulldown transistor 658A are in a deactivated state. In the example, the ramp event in the ramp signal Vramp 678 is configured to occur after the first pullup transistor 656A transitions from an activated state to a deactivated state, and before the first pulldown transistor 658A transitions from the deactivated state to the activated state. It is appreciated that the ramp generator illustrated in FIG. 6A is one example of an active discharge circuit, and that in other embodiments, other examples of active discharge circuits with active devices as described may be utilized for slope control circuit 676 in accordance with the teachings of the present invention.

Continuing with the depicted example, the plurality of pullup transistors also includes a second pullup transistor 656N in switch driver 668N that is coupled between the voltage supply VH and a second output node, which is coupled to output a sample and hold reset control signal SHR 648N. A second pulldown transistor 658N of the plurality of pulldown transistors is coupled between the second output node and the ground node. In one example, the sample and hold reset control signal SHR 648N is coupled to drive a first sample and hold switch coupled to a second row (e.g., row[n−1]) of a pixel array. The first sample and hold switch of the second row of the pixel array may also correspond to for instance the sample and hold reset switch 332 shown in FIG. 3. The plurality of global connection switches also includes a second global connection switch 672N in switch driver 668N that is coupled between the second output node and the slope control circuit 676.

A third pullup transistor 662A of the plurality of pullup transistors is coupled between the voltage supply VH and a third output node, which is coupled to output a sample and hold signal control signal SHS 650A. A third pulldown transistor 664A of the plurality of pulldown transistors is coupled between the third output node and the ground node. In one example, the sample and hold signal control signal SHS 650A is coupled to drive a second sample and hold switch coupled to the first row (e.g., row[0]) of a pixel array. The second sample and hold switch of the first row of the pixel array may correspond to for instance the sample and hold signal switch 334 shown in FIG. 3. The plurality of global connection switches also includes a third global connection switch 674A in switch driver 668A that is coupled between the third output node and the slope control circuit 676.

A fourth pullup transistor 662N of the plurality of pullup transistors is coupled between the voltage supply VH and a fourth output node, which is coupled to output a sample and hold signal control signal SHS 650N. A fourth pulldown transistor 664N of the plurality of pulldown transistors is coupled between the fourth output node and the ground node. In one example, the sample and hold signal control signal SHS 650N is coupled to drive a second sample and hold switch coupled to the second row (e.g., row[n−1]) of a pixel array. The second sample and hold switch of the second row of the pixel array may also correspond to for instance the sample and hold signal switch 334 shown in FIG. 3. The plurality of global connection switches also includes a fourth global connection switch 674N in switch driver 668N that is coupled between the fourth output node and the slope control circuit 676.

Figure 6B:
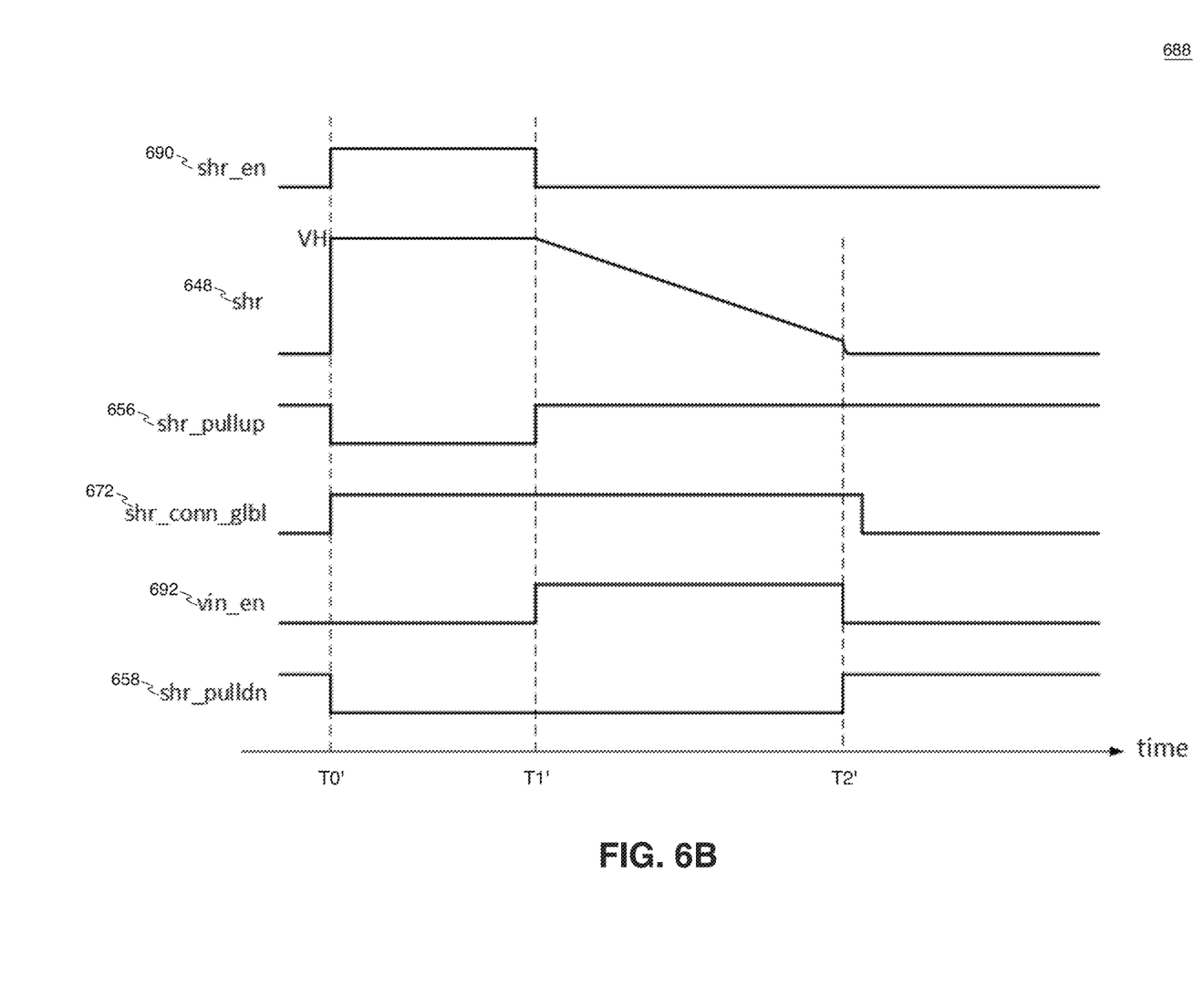
FIG. 6B is a timing diagram that illustrates some of the signals in the example sample and hold switch driver with slope control illustrated in FIG. 6A in accordance with the teachings of the present invention.

FIG. 6B is a timing diagram that illustrates some of the signals that correspond to the example sample and hold switch driver with slope control illustrated in FIG. 6A in accordance with the teachings of the present invention. As shown, prior to time T0', a sample and hold reset enable signal shr_en 690 is deactivated, a sample and hold reset control signal shr 648 is deactivated, a sample and hold reset pullup control signal shr_pullup 656 is deactivated (e.g., active low for a PMOS pull up transistor 656A), a sample and hold reset global connection switch control signal shr_conn_glbl 672 is deactivated, an input voltage enable signal vin_en 692 is deactivated, and a sample and hold reset pulldown control signal shr_pulldown 658 is activated (e.g., active high for an NMOS pull down transistor 658A).

At time T0', the sample and hold reset enable signal shr_en 690 is activated, the sample and hold reset control signal shr 648 is pulled up to VH, the sample and hold reset pullup control signal shr_pullup 656 is activated, the sample and hold reset global connection switch control signal shr_conn_glbl 672 is activated, the input voltage enable signal vin_en 692 remains deactivated, and the sample and hold reset pulldown control signal shr_pulldown 658 is deactivated. As shown, it is noted that the sample and hold reset global connection switch control signal shr_conn_glbl 672 is activated before the input voltage enable signal vin_en is activated to charge up the discharge node 659 to conduct a successful global discharge afterwards.

At time T1', the sample and hold reset enable signal shr_en 690 is deactivated, and a ramp event begins in the sample and hold reset control signal shr 648. At this time, the sample and hold reset pullup control signal shr_pullup 656 is deactivated, the sample and hold reset global connection switch control signal shr_conn_glbl 672 remains activated, the input voltage enable signal vin_en 692 is activated, which enables the ramp event to occur in the ramp signal Vramp 678, and the sample and hold reset pulldown control signal shr_pulldown 658 remains deactivated. As such, it is appreciated that the ramp event is configured to occur in the sample and hold reset control signal shr 648 while the sample and hold reset global connection switch control signal shr_conn_glbl 672 is in an activated state, and while the sample and hold reset pullup control signal shr_pullup 656 and the sample and hold reset pulldown control signal shr_pulldown 658 are in a deactivated state.

At time T2', the sample and hold reset enable signal shr_en 690 remains deactivated, and the ramp event in the sample and hold reset control signal shr 648 is complete. It is appreciated of course that the slope and/or the voltage range of the ramp event in the sample and hold reset control signal shr 648 illustrated in FIG. 6B is provided for explanation purposes, and that in other examples, other slopes and/or voltage ranges for the sample and hold reset control signal shr 648 ramp event to fall to at the end of the ramp event at time T2' may be utilized in accordance with the teachings of the present invention. At this time, the sample and hold reset pullup control signal shr_pullup 656 remains deactivated, the sample and hold reset global connection switch control signal shr_conn_glbl 672 is deactivated shortly after time T2', the input voltage enable signal vin_en 692 is deactivated at time T2' since the ramp event in the sample and hold reset control signal shr 648 is complete, and the sample and hold reset pulldown control signal shr_pulldown 658 is activated. As such, it is appreciated that the ramp event in the sample and hold reset control signal shr 648 is configured to occur after the sample and hold reset pullup control signal shr_pullup 656 transitions from an activated state to a deactivated state, and before the sample and hold reset pulldown control signal shr_pulldown 658 transitions from the deactivated state to the activated state.

Figure 7A:
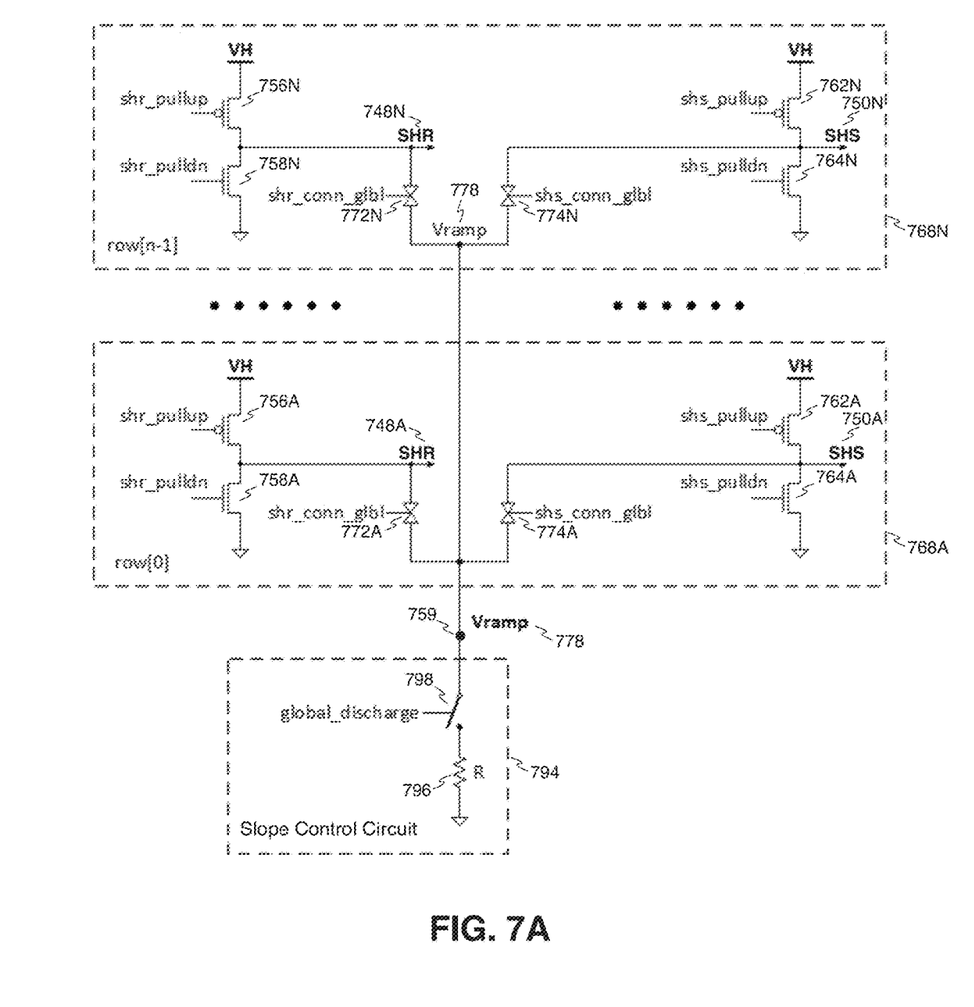
FIG. 7A shows a schematic of still another example sample and hold switch driver with slope control in an image sensor in accordance with the teachings of the present invention.

FIG. 7A shows a schematic of still another example of a sample and hold switch driver with slope control in an image sensor in accordance with the teachings of the present invention. As shown in the depicted example, the sample and hold switch driver circuitry includes a switch driver 768A that includes a plurality of pullup transistors, which includes a first pullup transistor 756A. As shown, first pullup transistor 756A is coupled between a voltage supply VH and a first output node, which is coupled to output a sample and hold reset control signal SHR 748A. In one example, the sample and hold reset control signal SHR 748A is coupled to drive a first sample and hold switch coupled to a first row (e.g., row[0]) of a pixel array. The first sample and hold switch of the first row of the pixel array may correspond to for instance the sample and hold reset switch 332 shown in FIG. 3. Switch driver 768A also includes a plurality of pulldown transistors, which includes a first pulldown transistor 758A that is coupled between the first output node and a ground node. A slope control circuit 794 is also coupled to the ground node, and a plurality of global connection switches, which includes a first global connection switch 772A that is coupled between the first output node and the slope control circuit 794.

In the example depicted in FIG. 7A, slope control circuit 794 is coupled to a discharge node 759 that is coupled to the first global connection switch 772A. In the example, slope control circuit 794 is a passive discharge circuit that includes passive devices that are coupled to discharge the discharge node 759. In particular, in the example illustrated in FIG. 7A, the passive discharge circuit of slope control circuit 794 includes an RC decay circuit that is coupled to generate an RC decay signal Vramp 778 at discharge node 759. As such, the RC decay circuit of slope control circuit 794 is coupled to control the discharge of the discharge node 759 at a slope determined by the RC decay signal Vramp 778. In one example, slope control circuit 794 includes a global discharge switch 798 that is coupled between the discharge node 759 and a resistor R 796. The global discharge switch 798 is configured to be responsive to a global discharge signal global_discharge. As will discussed in further detail below, in one example, a decay event is configured to occur in the decay signal Vramp 778 while the first global connection switch 772A is in an activated state, and while the first pullup transistor 756A and the first pulldown transistor 758A are in a deactivated state. In the example, the decay event in the ramp signal Vramp 778 is configured to occur after the first pullup transistor 756A transitions from an activated state to a deactivated state, and before the first pulldown transistor 758A transitions from the deactivated state to the activated state. It is appreciated that the RC decay circuit illustrated in FIG. 7A is one example of a passive discharge circuit, and that in other embodiments, other examples of passive discharge circuits with passive devices as described may be utilized for slope control circuit 794 in accordance with the teachings of the present invention.

Continuing with the depicted example, the plurality of pullup transistors also includes a second pullup transistor 756N in switch driver 768N that is coupled between the voltage supply VH and a second output node, which is coupled to output a sample and hold reset control signal SHR 748N. A second pulldown transistor 758N of the plurality of pulldown transistors is coupled between the second output node and the ground node. In one example, the sample and hold reset control signal SHR 748N is coupled to drive a first sample and hold switch coupled to a second row (e.g., row[n−1]) of a pixel array. The first sample and hold switch of the second row of the pixel array may also correspond to for instance the sample and hold reset switch 332 shown in FIG. 3. The plurality of global connection switches also includes a second global connection switch 772N in switch driver 768N that is coupled between the second output node and the slope control circuit 794.

A third pullup transistor 762A of the plurality of pullup transistors is coupled between the voltage supply VH and a third output node, which is coupled to output a sample and hold signal control signal SHS 750A. A third pulldown transistor 764A of the plurality of pulldown transistors is coupled between the third output node and the ground node. In one example, the sample and hold signal control signal SHS 750A is coupled to drive a second sample and hold switch coupled to the first row (e.g., row[0]) of a pixel array. The second sample and hold switch of the first row of the pixel array may correspond to for instance the sample and hold signal switch 334 shown in FIG. 3. The plurality of global connection switches also includes a third global connection switch 774A in switch driver 768A that is coupled between the third output node and the slope control circuit 794.

A fourth pullup transistor 762N of the plurality of pullup transistors is coupled between the voltage supply VH and a fourth output node, which is coupled to output a sample and hold signal control signal SHS 750N. A fourth pulldown transistor 764N of the plurality of pulldown transistors is coupled between the fourth output node and the ground node. In one example, the sample and hold signal control signal SHS 750N is coupled to drive a second sample and hold switch coupled to the second row (e.g., row[n−1]) of a pixel array. The second sample and hold switch of the second row of the pixel array may also correspond to for instance the sample and hold signal switch 334 shown in FIG. 3. The plurality of global connection switches also includes a fourth global connection switch 774N in switch driver 768N that is coupled between the fourth output node and the slope control circuit 794.

Figure 7B:
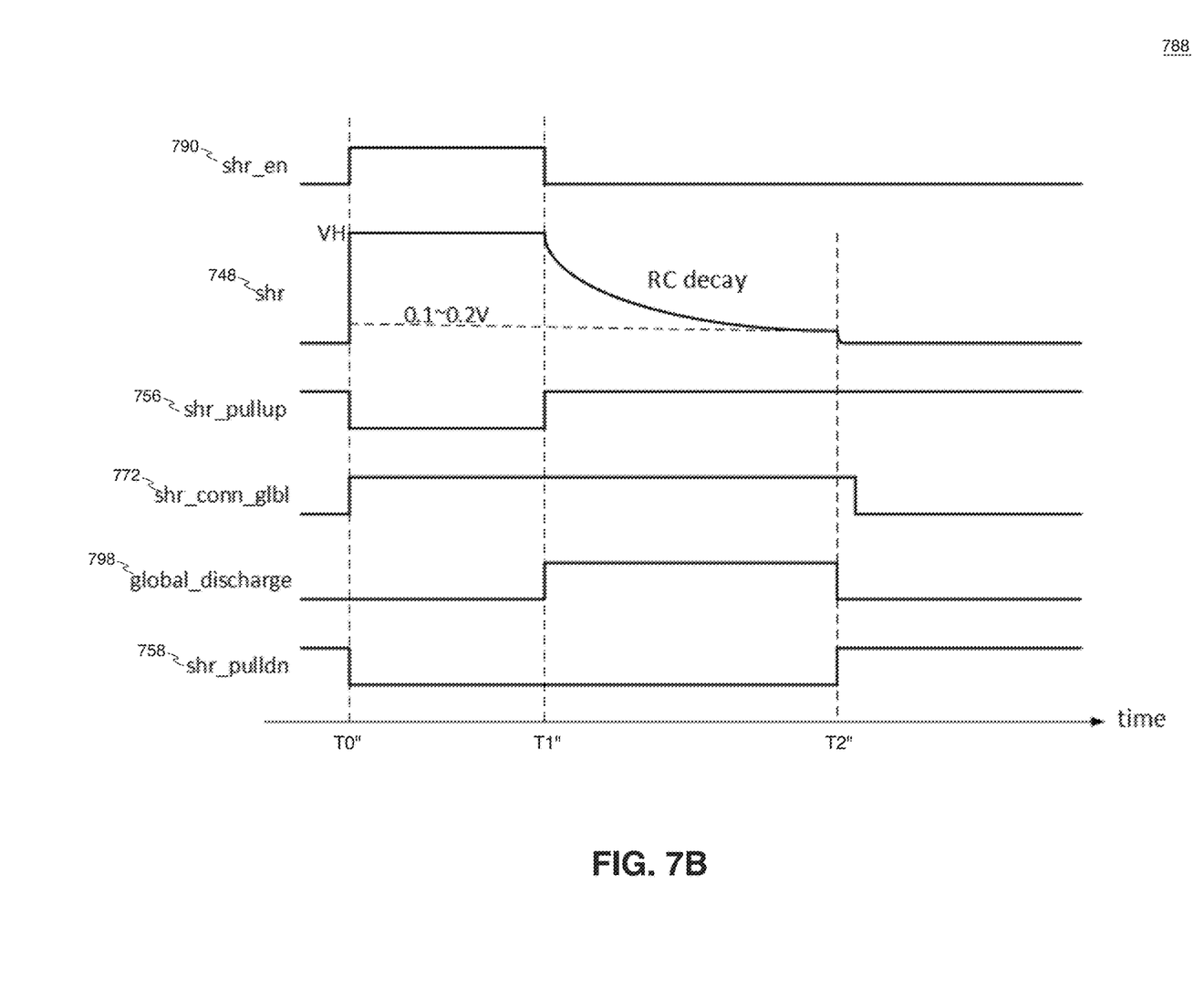
FIG. 7B is a timing diagram that illustrates some of the signals in the example sample and hold switch driver with slope control illustrated in FIG. 7A in accordance with the teachings of the present invention.

FIG. 7B is a timing diagram that illustrates some of the signals in the example sample and hold switch driver with slope control illustrated in FIG. 7A in accordance with the teachings of the present invention. As shown, prior to time T0", a sample and hold reset enable signal shr_en 790 is deactivated, a sample and hold reset control signal shr 748 is deactivated, a sample and hold reset pullup control signal shr_pullup 756 is deactivated (e.g., active low for a PMOS pull up transistor 756A), a sample and hold reset global connection switch control signal shr_conn_glbl 772 is deactivated, a global_discharge signal global_discharge 798 is deactivated, and a sample and hold reset pulldown control signal shr_pulldown 758 is activated (e.g., active high for an NMOS pull down transistor 758A).

At time T0", the sample and hold reset enable signal shr_en 790 is activated, the sample and hold reset control signal shr 748 is pulled up to VH, the sample and hold reset pullup control signal shr_pullup 756 is activated, the sample and hold reset global connection switch control signal shr_conn_glbl 772 is activated, the global_discharge signal global_discharge 798 remains deactivated, and the sample and hold reset pulldown control signal shr_pulldown 758 is deactivated. As such, it is appreciated that the common discharge node 759 is charged up to VH before the global_discharge signal global_discharge 798 starts a discharging event.

At time T1", the sample and hold reset enable signal shr_en 790 is deactivated, and an RC decay event begins in the sample and hold reset control signal shr 748. At this time, the sample and hold reset pullup control signal shr_pullup 756 is deactivated, the sample and hold reset global connection switch control signal shr_conn_glbl 772 remains activated, the global_discharge signal global_discharge 798 is activated, which enables the RC decay event to occur in the decay signal Vramp 778, and the sample and hold reset pulldown control signal shr_pulldown 758 remains deactivated. As such, it is appreciated that the RC decay event is configured to occur in the sample and hold reset control signal shr 748 while the sample and hold reset global connection switch control signal shr_conn_glbl 772 is in an activated state, and while the sample and hold reset pullup control signal shr_pullup 756 and the sample and hold reset pulldown control signal shr_pulldown 758 are in a deactivated state.

At time T2", the sample and hold reset enable signal shr_en 690 remains deactivated, and the RC decay event in the sample and hold reset control signal shr 748 is complete. In the depicted example, the RC decay event begins with the sample and hold reset control signal shr 748 being pulled up to a voltage of VH, and the sample and hold reset control signal shr 748 decay event falls to approximately 0.1-0.2V at the end of the decay event at time T2". It is appreciated of course that the 0.1-0.2V range illustrated in FIG. 7B is provided for explanation purposes, and that in other examples, other voltage ranges for the sample and hold reset control signal shr 748 decay event to fall to at the end of the decay event at time T2" may be utilized in accordance with the teachings of the present invention. At this time, the sample and hold reset pullup control signal shr_pullup 756 remains deactivated, the sample and hold reset global connection switch control signal shr_conn_glbl 672 is deactivated shortly after time T2", the global_discharge signal global_discharge 798 is deactivated at time T2" since the RC decay event in the sample and hold reset control signal shr 748 is complete, and the sample and hold reset pulldown control signal shr_pulldown 658 is activated. As such, it is appreciated that the RC decay event in the decay signal Vramp 778 is configured to occur after the sample and hold reset pullup control signal shr_pullup 756 transitions from an activated state to a deactivated state, and before the sample and hold reset pulldown control signal shr_pulldown 758 transitions from the deactivated state to the activated state.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A switch driver circuit, comprising:
a plurality of pullup transistors, wherein the plurality of pullup transistors includes a first pullup transistor coupled between a voltage supply and a first output node;
a plurality of pulldown transistors, wherein the plurality of pulldown transistors includes a first pulldown transistor coupled between the first output node and a ground node;
a slope control circuit coupled to the ground node; and
a plurality of global connection switches, wherein the plurality of global connection switches includes a first global connection switch coupled between the first output node and the slope control circuit.

2. The switch driver circuit of claim 1, wherein the slope control circuit comprises an active discharge circuit coupled to generate a ramp signal.

3. The switch driver circuit of claim 2, wherein a ramp event in the ramp signal is configured to occur while the first global connection switch is in an activated state, and while the first pullup transistor and the first pulldown transistor are in a deactivated state.

4. The switch driver circuit of claim 3, wherein the ramp event in the ramp signal is configured to occur after the first pullup transistor transitions from the activated state to the deactivated state, and before the first pulldown transistor transitions from the deactivated state to the activated state.

5. The switch driver circuit of claim 1, wherein the slope control circuit comprises a passive discharge circuit coupled to generate a decay signal, wherein the passive discharge circuit comprises:
a global_discharge switch coupled to the first global connection switch; and
a resistor coupled between the global_discharge switch and the ground node.

6. The switch driver circuit of claim 5, wherein a decay event in the decay signal is configured to occur while the first global connection switch is in an activated state, and while the first pullup transistor and the first pulldown transistor are in a deactivated state.

7. The switch driver circuit of claim 6, wherein the decay event in the decay signal is configured to occur after the first pullup transistor transitions from the activated state to the deactivated state, and before the first pulldown transistor transitions from the deactivated state to the activated state.

8. The switch driver circuit of claim 1, wherein the first output node is coupled to drive a first sample and hold switch coupled to a first row of a pixel array.

9. The switch driver circuit of claim 8,
wherein the plurality of pullup transistors further includes:
a second pullup transistor coupled between the voltage supply and a second output node;
a third pullup transistor coupled between the voltage supply and a third output node; and
a fourth pullup transistor coupled between the voltage supply and a fourth output node;
wherein the plurality of pulldown transistors further includes:
a second pulldown transistor coupled between the second output node and the ground node;
a third pulldown transistor coupled between the third output node and the ground node; and
a fourth pulldown transistor coupled between the fourth output node and the ground node;
wherein the plurality of global connection switches further includes:
a second global connection switch coupled between the second output node and the slope control circuit;
a third global connection switch coupled between the third output node and the slope control circuit; and
a fourth global connection switch coupled between the fourth output node and the slope control circuit.

10. The switch driver circuit of claim 9,
wherein the second output node is coupled to drive a first sample and hold switch coupled to a second row of the pixel array, wherein the third output node is coupled to drive a second sample and hold switch coupled to the first row of the pixel array, and wherein the fourth output node is coupled to drive a second sample and hold switch coupled to the second row of the pixel array.

11. An imaging system, comprising:
a pixel array including a plurality of pixels;
control circuitry coupled to the pixel array to control operation of the pixel array; and
readout circuitry coupled to the pixel array to read out image data from the pixel array, wherein the readout circuitry includes:
sample and hold circuitry coupled to sample and hold the image data from the pixel array; and
a switch driver circuit coupled to the sample and hold circuitry to drive the plurality of sample and hold switches, wherein the switch driver circuit includes:
a plurality of pullup transistors, wherein the plurality of pullup transistors includes a first pullup transistor coupled between a voltage supply and a first output node;
a plurality of pulldown transistors, wherein the plurality of pulldown transistors includes a first pulldown transistor coupled between the first output node and a ground node;
a slope control circuit coupled to the ground node; and
a plurality of global connection switches, wherein the plurality of global connection switches include a first global connection switch coupled between the first output node and the slope control circuit.

12. The imaging system of claim 11, wherein the slope control circuit comprises an active discharge circuit coupled to generate a ramp signal.

13. The imaging system of claim 12, wherein a ramp event in the ramp signal is configured to occur while the first global connection switch is in an activated state, and while the first pullup transistor and the first pulldown transistor are in a deactivated state.

14. The imaging system of claim 13, wherein the ramp event in the ramp signal is configured to occur after the first pullup transistor transitions from the activated state to the deactivated state, and before the first pulldown transistor transitions from the deactivated state to the activated state.

15. The imaging system of claim 11, wherein the slope control circuit comprises a passive discharge circuit coupled to generate a decay signal, wherein the passive discharge circuit comprises:
a global discharge switch coupled to the first global connection switch; and
a resistor coupled between the global discharge switch and the ground node.

16. The imaging system of claim 15, wherein a decay event in the decay signal is configured to occur while the first global connection switch is in an activated state, and while the first pullup transistor and the first pulldown transistor are in a deactivated state.

17. The imaging system of claim 16, wherein the decay event in the decay signal is configured to occur after the first pullup transistor transitions from the activated state to the deactivated state, and before the first pulldown transistor transitions from the deactivated state to the activated state.

18. The imaging system of claim 11, wherein the first output node is coupled to drive a first sample and hold switch coupled to a first row of a pixel array.

19. The imaging system of claim 18,
wherein the plurality of pullup transistors further includes:
a second pullup transistor coupled between the voltage supply and a second output node;
a third pullup transistor coupled between the voltage supply and a third output node; and
a fourth pullup transistor coupled between the voltage supply and a fourth output node;
wherein the plurality of pulldown transistors further includes:
a second pulldown transistor coupled between the second output node and the ground node;
a third pulldown transistor coupled between the third output node and the ground node; and
a fourth pulldown transistor coupled between the fourth output node and the ground node;
wherein the plurality of global connection switches further includes:
a second global connection switch coupled between the second output node and the slope control circuit;
a third global connection switch coupled between the third output node and the slope control circuit; and
a fourth global connection switch coupled between the fourth output node and the slope control circuit.

20. The imaging system of claim 19,
wherein the second output node is coupled to drive a first sample and hold switch coupled to a second row of the pixel array,
wherein the third output node is coupled to drive a second sample and hold switch coupled the first row of the pixel array, and
wherein the fourth output node is coupled to drive a second sample and hold switch coupled to the second row of the pixel array.

* * * * *